United States Patent
Takahashi et al.

[11] Patent Number: 5,958,132
[45] Date of Patent: Sep. 28, 1999

[54] SIC SINGLE CRYSTAL AND METHOD FOR GROWTH THEREOF

[75] Inventors: Jun Takahashi; Masatoshi Kanaya; Yuichiro Fujiwara; Noboru Ohtani, all of Kanagawa-ken, Japan

[73] Assignee: Nippon Steel Corporation, Japan

[21] Appl. No.: 08/856,248

[22] Filed: May 14, 1997

Related U.S. Application Data

[63] Continuation of application No. 08/410,731, Mar. 27, 1995, abandoned, which is a continuation-in-part of application No. 08/264,744, Jun. 22, 1994, abandoned, which is a continuation of application No. 07/870,639, Apr. 20, 1992, abandoned.

[30] Foreign Application Priority Data

Apr. 18, 1991 [JP] Japan ................................. 3-087020
Jan. 20, 1992 [JP] Japan ................................. 4-007684
Mar. 25, 1994 [JP] Japan ................................. 6-056036

[51] Int. Cl.⁶ ................................................. C30B 23/06
[52] U.S. Cl. ........................... 117/84; 117/87; 117/109; 117/951; 148/DIG. 148
[58] Field of Search ............... 117/109, 84, 87, 117/951; 148/DIG. 148

[56] References Cited

U.S. PATENT DOCUMENTS

| | | | |
|---|---|---|---|
| 2,854,364 | 9/1958 | Lely | 117/951 |
| 3,634,149 | 1/1972 | Knippenberg | 117/951 |
| 4,556,436 | 12/1985 | Addamiano | 117/951 |
| 4,866,005 | 9/1989 | Davis et al. | |
| 5,011,549 | 4/1991 | Kong et al. | 148/DIG. 148 |
| 5,200,022 | 4/1993 | Kong et al. | 148/DIG. 148 |

FOREIGN PATENT DOCUMENTS

| | | | |
|---|---|---|---|
| 63-57400 | 11/1988 | Japan . | |
| 2-48495 | 2/1990 | Japan . | |
| 02290084 | 11/1990 | Japan | 117/951 |
| 2290084 | 11/1990 | Japan . | |

OTHER PUBLICATIONS

Tairov et al. "General Principles of Growing Large–Size Single Crystals of Various Silicon Carbide Polytypes", Jour. of Crystal Growth vol. 52 (1981) pp. 146–150.

Koga et al., Single Crystal Growth of 6H–SiC by a Vacuum Sublimation Method, Ext. ABS. of the 17$^{th}$ Conf. on Solid State Materials 1985 pp. 249–252.

Data EFM–88–24, p. 24, published by Electric Science Society (Japan), Electronic Material Study Group, on Sep. 5, 1988.

Tairov et al., *Journal of Crystal Growth*, 36, 147–151 (1976).

Tairov et al., *Journal of Crystal Growth*, 43, 209–212 (1978).

Tairov et al., *Journal of Crystal Growth*, 52, 146–150 (1981).

Koga et al., *Vacuum*, 30(11), 886–892.

Koga et al., Extended Abstracts of the 17th Conference on Solid State Devices and Materials, Tokyo, pp. 249–252 (1985).

*Primary Examiner*—Robert Kunemund
*Attorney, Agent, or Firm*—Wenderoth, Lind & Ponack, L.L.P.

[57] ABSTRACT

A method for the growth of a SiC single crystal comprising introducing a seed crystal of SiC single crystal having an exposed face deviating from the {0001} plane by an angle $\alpha_1$ of about 60° to about 120°, typically about 90° and SiC powder as a raw material into a graphite crucible, elevating the temperature of the SiC powder in an atmosphere of inert gas to a level sufficient for sublimation, meanwhile elevating the temperature of the exposed face of the seed crystal to a level slightly lower than the temperature of the SiC powder, and keeping the SiC powder and the seed crystal at the specific temperatures for a period enough for a SiC single crystal of the same polytype as the seed crystal to grow to a desired height on the exposed face of the seed crystal.

15 Claims, 5 Drawing Sheets

SIC SINGLE CRYSTAL AND METHOD FOR GROWTH THEREOF

This application is a continuation of now abandoned application, Ser. No. 08/410,731, filed Mar. 27, 1995, which is a continuation-in-part of application Ser. No. 08/264,744 filed Jun. 22, 1994, now abandoned, which was a continuation of application Ser. No. 07/870,639 filed Apr. 20, 1992, abandoned.

BACKGROUND OF THE INVENTION

1. Field of the Invention

This invention relates to a SiC single crystal and a method for the growth thereof. More particularly, this invention relates to a method for the growth of a SiC single crystal of good quality which is useful in the field of applications such as to a short wavelength operated light-emitting diode or to an electrical device, and useful as a seed crystal for growth of another SiC single crystal ingot.

2. Prior Art

The SiC single crystal is a material physically and chemically stable and capable of withstanding the impacts of high temperature and radiation and, therefore, is expected to find utility as a material for semiconductor elements resistant to the impacts of environment. Further, the SiC single crystal has already found utility as a material for light-emitting diodes operating with short wavelengths owing to a wide bandgap. In fact, the 6H—SiC has bandgap of about 2.9 eV at normal room temperature and, therefore, serves favorably as a material for blue light-emitting diodes. The 4H—SiC has bandgap of about 3.1 eV and, therefore, serves favorably as a material for purple light-emitting diodes.

The SiC single crystal ingot is produced by the sublimation-recrystallization method. As the seed crystal for this production, a SiC single crystal substrate having a {0001} face (c face or the basal plane) thereof exposed has been mainly used heretofore. In this case, since the seed crystal does not always induce growth of a polytype identical thereto, it has been customary to attempt the growth of a polytype aimed at by optimizing the conditions of growth such as temperature and pressure. Japanese Unexamined Patent Publication No. 48,495/1990 discloses a method for the growth of 4H—SiC single crystal. The specification of this publication has a mention to the effect that 6H polytype crystal grows on the lower temperature side and 4H polytype crystal grows on the higher temperature side respectively of the neighborhood of 2,250° C. as the seed crystal temperature. By this method, the control of growth for the formation of the polytype aimed at cannot be effected completely and the produced crystal tends to suffer from degradation of crystallinity owing to the mixture of other polytype.

Data EFM-88-24, p. 24, published by Electric Science Society (Japan), Electronic Material Study Group, on Sep. 5, 1988 has a report on the evaluation of a SiC single crystal obtained by the method mentioned above. The report reads that when the SiC single crystal is etched with fused KOH to unveil defects contained in the crystal, numerous etch pits presumably corresponding to dislocations appear, that these etch pits are hexagonal pits grouped into three sizes, i.e. $10^2$ to $10^3$ of large size/cm$^2$, $10^4$ of medium size/cm$^2$, and $10^5$ of small size/cm$^2$ as arranged in the decreasing order of size, and that these etch pits correspond to dislocations or linear defects. Particularly, the defects which correspond to large etch pits form pinholes piercing the crystal and constitute themselves a cause such as for leak current in a device to be made of the crystal. The defect is called as an "empty tube" or "micropipe" defect.

SUMMARY OF THE INVENTION

An object of this invention is to provide an improved SiC single crystal and a method for the production thereof. Another object of this invention is to provide a method for growing at a high speed a SiC single crystal of fine quality having the same polytype structure as the seed crystal. Still another object of this invention is to provide a method for growing at a high speed a SiC single crystal containing substantially no or little dislocations and defects. Further object of this invention is to provide a method for growing at a high speed a SiC single crystal of fine quality and containing substantially no or little growing of crystal grain having a different crystal direction from the seed crystal.

(1) In the sublimation-recrystallization method (hereinafter called simply as "sublimation method") which comprises thermally sublimating SiC powder as a raw material in a graphite crucible under an atmosphere of an inert gas and causing the resultant SiC vapor to grow as a SiC single crystal on a SiC single crystal substrate of seed crystal kept at a temperature slightly lower than the temperature of the raw material, this invention is directed to a method for the growth of a SiC single crystal which is characterized by using as the seed crystal a SiC single crystal having an exposed crystal face deviating from {0001} plane by angle $\alpha_1$ of about 60° to about 120°, typically about 90°.

It is held that when atoms are disposed on the {0001} atomic layer of the SiC single crystal, the locations of these atoms occur in three kinds and, because of small energy differences between these kinds of locations, numerous polytypes are allowed to exist stably. When a polytype crystal aimed at is to be grown on the {0001} face which is devoid of a screw step, since the configuration of superposed atomic layers does not appear on the exposed surface, the polytype crystal aimed at must be nucleated by adjusting the conditions of growth such as temperature and pressure.

When the growth is to be attained on a surface deviating from {0001} plane by angle $\alpha_1$ of about 60° to about 120°, such as a surface perpendicular to the {0001} plane, since the configuration of superposed polytype crystal layers appears on the surface, the polytype crystal of the original seed crystal is easily grown under a wide range of conditions of growth without requiring the nucleation of a polytype crystal aimed at. In this case, a single crystal of excellent crystallinity containing no other polytypes is grown. The speed of growth is increased within the range in which the excellent crystal attains growth.

Further when the growth of a SiC single crystal is carried out by the conventional sublimation method using the {0001} face of a seed crystal, some dislocation defects occurs at the initial stage of the crystal growth, thus, a spiral growth occurs even if the seed crystal originally had not a screw dislocation on its surface. And, consequently, screw dislocations corresponding to the empty tube defects or the centers of growth spiral are formed and the dislocations persist in the subsequent growth of crystal. On the contrary, when the growth is performed on a surface deviating from {0001} plane by angle $\alpha_1$ of about 60° to about 120°, the spiral growth does not occur and the screw dislocations or the empty tube defects corresponding thereto do not form (The dislocations and defects are observed as hexagonal etch pits resulting from the etching with the fused KOH mentioned below.).

Regarding the angle $\alpha_1$, the more it nears 90°, the more ideal it becomes since the axial symmetry in the direction of crystal growth is improved. In such a case, the wafer-processing from the obtained ingot becomes more feasible.

The SiC single crystal ingot obtained by the present invention is finely regulated with respect to the polytype and has a fine quality without suffering from the above mentioned dislocation and defect.

(2) In a preferred embodiment of the method for the growth of an SiC single crystal according to this invention, a SiC single crystal having the {10$\bar{1}$0} face exposed is used as the seed crystal in the sublimation method. The reason for the desirability of the {10$\bar{1}$0} face, among the faces deviating from {0001} plane by angle $\alpha_1$ of about 90°, as the crystal face of the seed crystal is that the upper part of the single crystal being grown at a high temperature forms a {10$\bar{1}$0} facet and this facet does not allow easy formation of pits or defects under the impact of thermal etching. The "facet" is a flat face which appears at a crystal surface in growth, and generally which corresponds to one of the specific planes of the crystal. Because of this reason, the crystal part which has grown on the {10$\bar{1}$0} facet has a particularly fine quality.

When a crystal face deviating from {0001} plane by angle $\alpha_1$ of about 80° to <90° or >90° to about 100° in the direction of {10$\bar{1}$0} plane is used as the seed crystal (the {10$\bar{1}$0} face relates with $\alpha_1$=90°.), the upper part of the single crystal being grown at a high temperature is covered with {h0$\bar{h}$l} facets (wherein the "h" and the "l" are individual optional integrals.), thus, the formation of defects on the crystal growing surface under the impact of thermal etching is hardly proceeded as like as the case of using the {10$\bar{1}$0} face. Particularly, because of this reason, the crystal part which has grown on the {h0$\bar{h}$l} facets has a fine quality. Further, when a SiC single crystal substrate having a crystal face which has a rotation angle $\psi$ around the axis c from the above mentioned crystal face being in the range of +5° to −5° is used as the seed crystal, the upper part of the single crystal being grown at a high temperature forms the {h0$\bar{h}$l} facets. Thus, the similar effect can be obtained.

When a crystal face deviating from {0001} plane by angle $\alpha_1$ of about 60° to <80° or >100° to 120° in the direction of {10$\bar{1}$0} plane is used as the seed crystal, the upper part of the single crystal being grown at a high temperature is covered with {h0$\bar{h}$l} facets, thus, the formation of defects on the crystal surface in growth under the impact of thermal etching is hardly proceeded as like as the case of using the {10$\bar{1}$0} face. Particularly, because of this reason, the crystal part which has grown on the {h0$\bar{h}$l} facets have a fine quality. Further, when a SiC single crystal substrate having a crystal face which has a rotation angle $\psi$ around the axis c from the above mentioned crystal face being in the range of +5° to −5° is used as the seed crystal, the upper part of the single crystal being grown at a high temperature forms the {h0$\bar{h}$l} facets. Thus, the similar effect can be obtained.

Regarding the resistance to the thermal etching, the {10$\bar{1}$0} facet which is most stable has the strongest intensity. In the group of {h0$\bar{h}$l} facets, the larger inclination angle from the {10$\bar{1}$0} facet it becomes, the weaker resistance to the thermal etching it becomes. Because, the {10$\bar{1}$0} portion contained in the facet decreases relative to the degree of the inclination angle. Therefore, the angle $\alpha_1$ from {0001} plane in the direction of {10$\bar{1}$0} plane is most preferably at about 90°, then preferably at about 80° to <90° or >90° to 100°, and then at about 60° to <80° or >100° to 120°. When the rotation angle $\psi$ equals to zero, a particularly large {10$\bar{1}$0} facet or {h0$\bar{h}$l} facets can be formed. When the rotation angle $\psi$ is in the range of +5° to >0° or <0° to −5°, the {10$\bar{1}$0} facet or {h0$\bar{h}$l} facets appear with some inclination angle from the seed crystal face, and its size becomes smaller than the case of $\psi$=0. Therefore, the angle $\psi$ is most preferably at 0°, then preferably at +5° to >0° or <0° to −5°.

The SiC single crystal ingot obtained by this embodiment is finely regulated with respect to the polytype and has a particularly fine quality since it has no dislocation and defect mentioned above, and no or little pits or dislocations caused by thermal etching.

(3) In a preferred embodiment of the method for the growth of an SiC single crystal according to this invention, a SiC single crystal having the exposed face which is inclined from the plane vertical to the {0001} plane by an off-angle θ of 5° to 30° in the direction of (000$\bar{1}$)C plane is used as the seed crystal in the sublimation method.

Since SiC is the polar crystal, the face polarity appears on all of faces except the faces vertical to the {0001} plane. The properties of the face polarity may affect the etching speed in the etching with fused KOH, the oxide film formation speed in the thermal oxidation, and etc. Further, the face polarity may also affect the liability to appearance of crystal grains having crystal directions heterogeneous to that of the seed crystal. When the SiC single crystal is grown on the exposed face of the SiC seed crystal substrate, if the exposed face is a face inclined in the direction of (000$\bar{1}$)C plane from the plane vertical to the {0001} plane, appearance of crystal grains having crystal directions heterogeneous to that of the seed crystal is low as compared with the case of using a face inclined in the direction of (0001)Si plane from the plane vertical to the {0001} plane. That is because of the face polarity properties owned by the former face. Further, when compared with the case of using the face which is vertical to the {0001} plane and having non-polarity, the appearance of crystal grains having heterogeneous crystal directions is also low on the face inclined in the direction of (000$\bar{1}$)C plane. When the SiC ingot obtained have some crystal grains having crystal directions heterogeneous to that of the seed crystal, the ingot may be not the perfect single crystal but including polycrystal in a part. In that case, therefore, the yield of single crystal wafer sliced off from the ingot tends to low, and the product yield when producing devices with the wafer may be also particularly low. Furthermore, the obtained crystal is no longer available as a seed crystal for growing a SiC single crystal ingot by the the sublimation method.

If the off-angle θ in the direction of (000$\bar{1}$)C plane is larger than 30°, it would be impossible to obtain the crystal having a good quality as shown herein below. Namely, the obtained one is suffering from inclusion of some hetero polytypes, many dislocations and defects as mentioned above. If the off-angle θ in the direction of (000$\bar{1}$)C plane is smaller than 5°, the possibility for appearance of the crystal grains as mentioned above becomes high.

The SiC single crystal ingot obtained by this embodiment is finely regulated with respect to the polytype and has a fine quality with a high yield since it has no dislocation and defect mentioned above and has little occurrence of the crystal grains.

(4) In a more preferred embodiment of the method for the growth of an SiC single crystal according to this invention, a SiC single crystal having the exposed face which is inclined from the {10$\bar{1}$0} plane by an off-angle θ of 5° to 30°, more preferably 5° to 10° in the direction of (000$\bar{1}$)C plane is used as the seed crystal in the sublimation method. In this case, the upper part of the single crystal being grown at a high temperature is covered with {h0$\bar{h}$l} facets, thus, the formation of defects on the crystal surface in growth under the impact of thermal etching is hardly proceeded as mentioned above. Also as mentioned above, regarding the resistance to the thermal etching of the {h0h̄l} facets, the larger inclination angle from the {10 1̄0} facet (or off-angle θ) it becomes, the weaker resistance to the thermal etching it becomes. Because, the {10 1̄0} portion contained in the facet decreases relative to the degree of the inclination angle. Therefore, the off-angle θ is most preferably in the range of 5° to 10°, then preferably in the range of >10° to 30°.

Further, when a SiC single crystal substrate having a crystal face which has a rotation angle ψ around the axis c from the above mentioned crystal face being in the range of +5° to −5° is used as the seed crystal, the upper part of the single crystal being grown at a high temperature forms the {h0h̄l} facets. Thus, the similar effect can be obtained. When the rotation angle ψ equals to zero, a particularly large {h0h̄l} facet can be formed. When the rotation angle ψ is in the range of +5° to >0° or <0° to −5°, the {h0h̄l} facets appears with some inclination angle from the seed crystal face, and its size becomes smaller than the case of ψ=0. Therefore, the angle ψ is most preferably at 0°, then preferably at +5° to >0° or <0° to −5°.

The SiC single crystal ingot obtained by this embodiment is finely regulated with respect to the polytype and has a particularly fine quality with a high yield since it has no dislocation and defect mentioned above, little occurrence of the crystal grains, and no or little pits or dislocations caused by thermal etching.

(5) In another preferred embodiment of this invention, a second SiC single crystal which is cut from one of specific parts of a SiC single crystal ingot grown on the exposed surface of the first seed crystal mentioned above and which has an exposed face deviating from {0001} plane by angle $\alpha_2$ of about 60° to about 120°, typically about 90° is used as the seed crystal. The specific parts are the regions positioned outside two parallel virtual planes deviating by the angle $\alpha_1$ from a first virtual plane including the exposed face of the first seed crystal. The lines of intersection of the first virtual plane and the two second virtual planes are lines which perpendicularly intersect the c-axis or [0001] axis of the first seed crystal and pass the terminal parts of this seed crystal relative to the direction of the c-axis.

By working this invention, it is made possible to manufacture a SiC single crystal ingot of fine quality to be grown in a desired polytype structure at a high speed and allow supply of high-quality single crystal wafers, which wafers are useful in various applications such as blue light-emitting diodes or purple light-emitting diodes, devices resistant to impacts of the environment, and also useful as a seed crystal substrate for growing SiC single crystal ingot.

DETAILED DESCRIPTION OF THE INVENTION

Now, this invention will be described in detail below with reference to the accompanying drawings.

Figure 1:
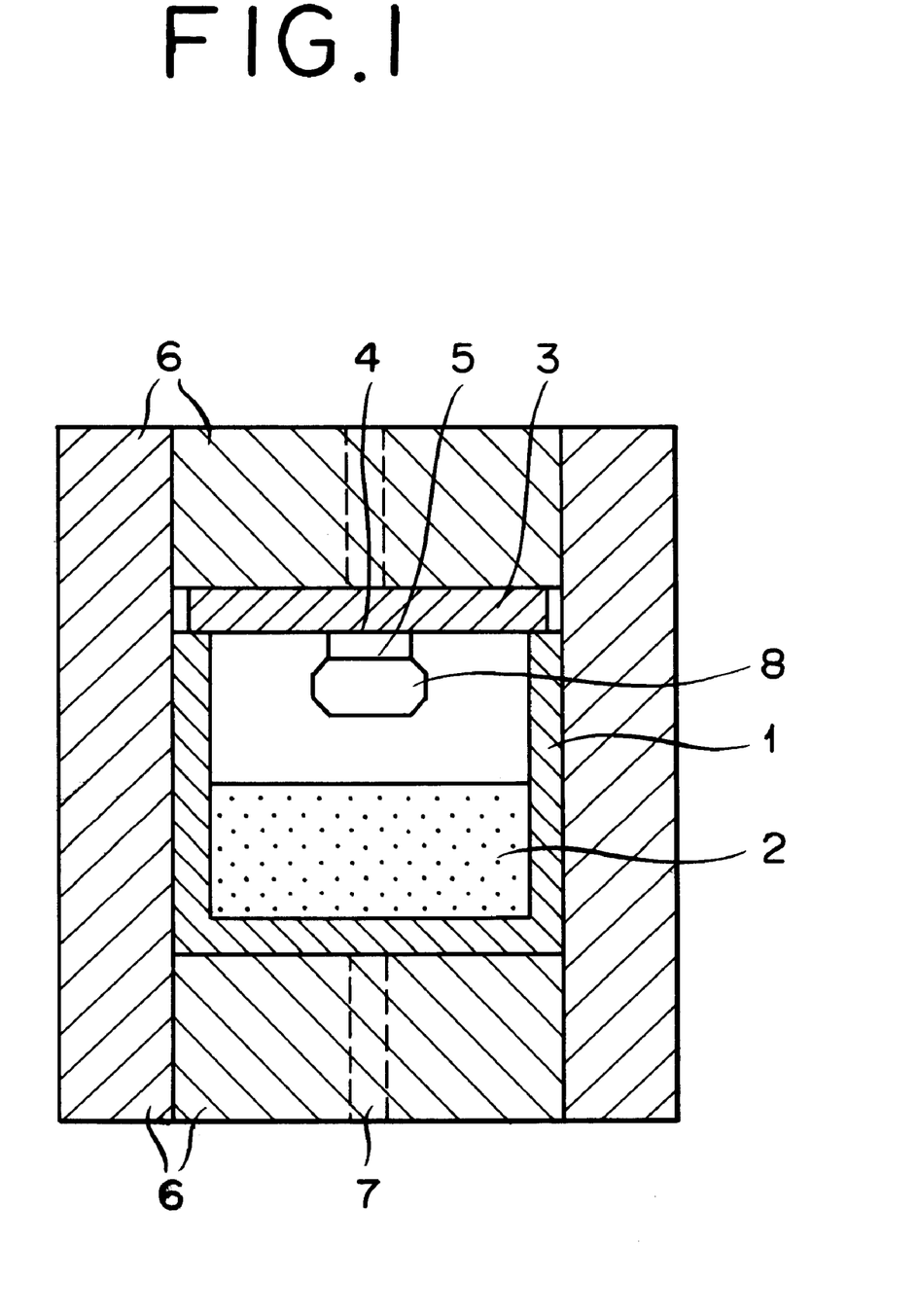
FIG. 1 is a sectional view illustrating in the form of a model one example of the construction of an apparatus to be used for the growth of a SiC single crystal of this invention.

FIG. 1 illustrates one example of the apparatus to be used for the growth of a SiC single crystal of this invention. As illustrated in FIG. 1, a crucible made of graphite and used in the apparatus for the growth of the single crystal is composed of a bottomed crucible main body 1 and a crucible lid 3 provided with a fitting part 4 for a SiC substrate seed crystal 5 and adapted to cover the opening part of the crucible main body 1. The crucible main body 1 and the crucible lid 3 are covered on the lateral surfaces and upper and lower surfaces thereof with insulating members 6 made of graphite felt. Desirably, the crucible main body 1 and the crucible lid 3 invariably made of graphite having a similar thermal expansion coefficient with that of silicon carbide being used. These components are placed in a container which is capable of being vacuumized with a vacuumizing device and allowing control of the pressure of the internal atmosphere with an inactive gas such as Ar and Xe. The heating is effected as by the use of a rf induction coil wound round the periphery of the container. The crucible temperature is constantly measured by means of a dichromic pyrometer using the light of the lower part of the crucible led out through a light path 7 of a diameter of 2 to 4 mm formed in the central part of the felt covering the lower part of the crucible main body 1, being regarded as the temperature of the source. The temperature of the crucible lid 3 measured similarly through a light path formed in advance in the upper felt is regarded as the temperature of the seed crystal.

The growth of a SiC single crystal in accordance with this invention using the apparatus for growth of a single crystal illustrated in FIG. 1 is carried out as follows, for example.

First, a substrate having a desired face exposed is set in place as the seed crystal 5 on the crucible lid 3 and SiC powder 2 as a raw material is introduced into the crucible main body 1. The desired face of seed crystal 5 is set so as not to face the inner surface of crucible lid 3, namely, so as to face the SiC powder 2 introduced into the crucible main body 1. The SiC powder 2 as the raw material is desired to be high quality and substantially contain no imparities such as Fe, Al and other metals.

The crucible which has the seed crystal 5 and the SiC powder 2 as a raw material incorporated therein as contemplated is then set up with the insulating members 6 as shown in FIG. 1, and which is installed within the container mentioned above. After the installation, the interior of the container is vacuumized to a degree desirably not exceeding $10^{-6}$ Torr and the powder temperature is elevated to about 2,000° C. Thereafter, the internal pressure of the container is kept at about 600 Torr introducing the inert gas and the temperature of the powder is elevated to the level aimed at. Then, decompression is performed. The decompression is desired to be effected over a period of from 10 to 90 minutes. The growth of crystal is desired to be initiated after the pressure of the atmosphere in the container is set at a level in the range of from 1 to 50 Torr, preferably from 5 to 20 Torr and the temperature of the raw material at a level in the range of from 2,100 to 2,500° C., preferably from 2,200 to 2,400° C. If the temperature is lower than the lower limit of the range mentioned above, the raw material is sublimated with difficulty. If this temperature is higher than the higher limit of the range, the growth of a single crystal of high quality is inhibited as by thermal etching. This operation is desired to be performed so that the temperature of the seed crystal is 40° to 100° C., preferably 50 to 70° C., lower than that of the raw material and the thermal gradient between the seed crystal and the raw material is in the range of 5 to 25° C./cm, preferably from 10 to 20° C./cm. Further, the relation between the temperature and the pressure is desired to be such that the speed of growth of the single crystal is in the range of from 0.5 to 1.5 mm/hr, preferably from 0.8 to 1.3 mm/hr. The crystallinity is lowered if the speed is higher than the upper limit of the range mentioned above, whereas the productivity is impaired if the speed is lower than the lower limit of the range.

It will be easily understood by persons of ordinary skill in the art that the technique for enlarging the diameter of crystal which have been heretofore known in the conventional method for the production of a SiC single crystal by the use of a SiC single crystal substrate having an exposed {0001} face is applicable with no or only slight modification to the method of this invention for the production of a SiC single crystal.

The crystallinity of a SiC single crystal can be evaluated by etching with a fused KOH which is performed by the following procedure. The produced single crystal ingot is cut and polished so as to give rise to a {0001} wafer. At this time, due attention should be given to the cutting and polishing work lest it should leave residual strain behind in the produced wafer. The etching is performed with fused KOH at about 530° C. for about five minutes. The resultant etched crystal is observed by a Nomarski differential interference microscope to take count of etch pits formed in consequence of the etching.

The polytype of the grown single crystal and that of the seed crystal can be evaluated by the method of identification which resorts to Raman scattering, X-ray diffraction, or photoluminecsence at low temperature, for example.

The pits and defects formed by a thermal etching can be determined by observing the surface of the grown crystal visually. To examine in detail, the surface of a {0001} wafer which was cut off from the grown ingot and then polished is observed by a microscope.

The presence of crystal grains having the heterogeneous crystal directions can be determined easily by observing the surface of the grown crystal visually. When it it desired to examine the interior of crystal, it may be done that a {0001} face wafer which was cut off from the grown ingot and then polished is observed by a polarizing microscope.

Figure 2:
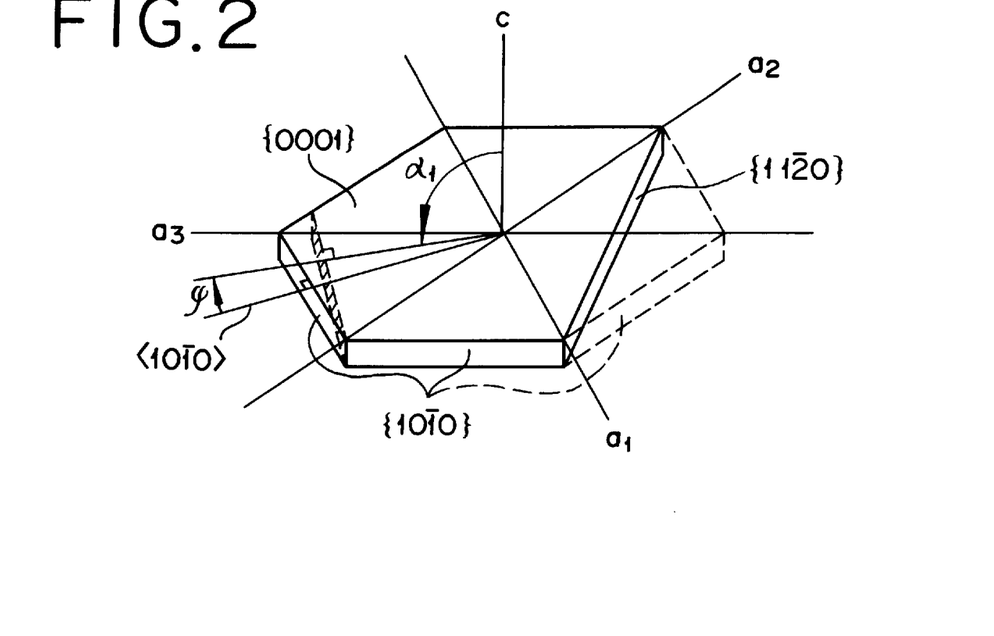
FIG. 2 is a diagram illustrating the plane indexes of a hexagonal SiC crystal.

FIG. 2 is intended to depict the plane indexes of the hexagonal SiC single crystal. The number of planes perpendicular to the {0001} plane ($\alpha_1$=90) which are to be used preferably in this invention are infinite [expressed as {hki0} in the plane index] inclusive of the {10 $\bar{1}$0} planes and the {11 $\bar{2}$0} plane which are shown in the diagram. The {10 $\bar{1}$0} planes is, for example the general term of the group consisting of six equivalent planes, i.e., (1 $\bar{1}$00), ($\bar{1}$ 100), (10 $\bar{1}$0), ($\bar{1}$010), (01 $\bar{1}$0) and (0$\bar{1}$ 10). The substrate having one of faces perpendicular to the {0001} plane may be obtained from a SiC single crystal ingot grown on the {0001} face seed crystal by the sublimation-recrystallization method, for example, by means of cutting it out of the ingot so as to expose the desired face perpendicular to the {0001} plane. The rotation angle ψ around the c-axis is, as shown in FIG. 2, the angle formed when rotating the plane interested from one of {10 $\bar{1}$0} planes around the c-axis. (In Figure, it is shown as the angle between the normal axis of the {10 $\bar{1}$0} plane and the normal axis of the plane interested.). Therefore, if the rotation angle ψ equals to 30°, the plane interested is a {11 $\bar{2}$0} plane, and if the rotation angle ψ equals to 60°, the plane interested is another {10 $\bar{1}$0} plane.

In this invention, however, it is considered that a SiC single crystal of fine quality is infallibly grown even when a substrate having an exposed face not exactly perpendicular to the {0001} plane but oblique to some extent thereto by an angle of not more than 30°, preferably not more than 10°, for example, is used as the seed crystal 5. Thus, the seed crystal to be used in this invention may have an exposed surface deviating from {0001} plane by angle $\alpha_1$ of about 60° to about 120°, preferably about 80° to 100°, more preferably about 90°.

The SiC single crystal 8 of this invention is obtained by using as the crystal seed 5 a SiC single crystal substrate having the exposed face such as above and according to the above mentioned procedure. This SiC single crystal thus obtained possesses the same polytype structure as the seed crystal 5, and unlike the conventional SiC single crystal which is obtained by the growth using a SiC single crystal substrate having an exposed {0001} face, avoids the occurrence of a screw dislocation corresponding to the empty tube defects or the center of spiral growth, when evaluated by above mentioned methods.

The SiC single crystal of this invention can be obtained by using as the crystal seed a SiC single crystal substrate having the {10 $\bar{1}$0} face exposed and according to the above mentioned procedure. The SiC single crystal of this invention can be also obtained by using as the crystal seed a SiC single crystal substrate having an exposed surface deviating from {0001} plane in the direction of {10 $\bar{1}$ 0} plane by angle $\alpha_1$ of about 60° to about 120°, preferably about 80° to 100°, and according to the above mentioned procedure. Further, The SiC single crystal of this invention can be obtained by using as the crystal seed a SiC single crystal substrate having an exposed surface which forms the rotation angle ψ around the axis c in the range of +5° to −5° with the plane deviating from {0001} plane in the direction of {10 $\bar{1}$0} plane by angle $\alpha_1$ of about 60° to about 120°, preferably about 80° to 100°, and according to the above mentioned procedure.

The SiC single crystals thus obtained possess the same polytype structure as the seed crystals, and avoid the occurrence of a screw dislocation corresponding to the empty tube defects or the center of spiral growth, when evaluated by above mentioned methods. Further, by observing surfaces of the crystals, they can be determined easily as they have facets, and as they have particularly fine qualities without suffering from the appearance of pits and defects caused by the thermal etching.

Figure 3:
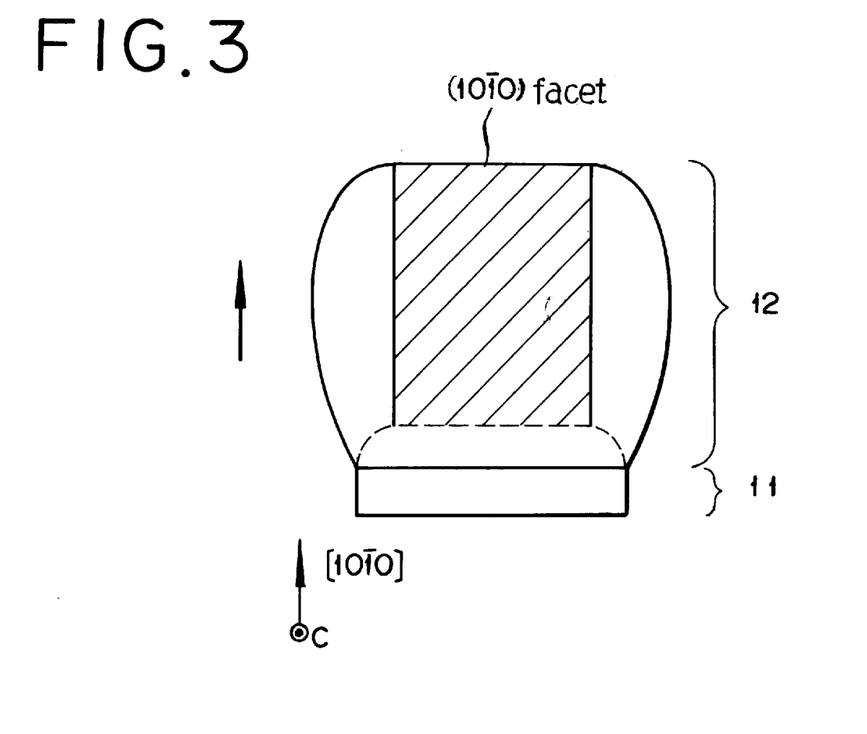
FIG. 3 is a diagram illustrating in the form of a model a crystal portion grown on a {10 1̄0} facet (depicted as hatched portion) in a SiC single crystal ingot obtained by an embodiment of this invention using a {10 1̄0} face seed crystal.

FIG. 3 illustrates a {0001} wafer which is cut out from the SiC single crystal ingot obtained by an embodiment of this invention using a {10 $\bar{1}$0} face seed crystal. The wafer consists of a {10 $\bar{1}$0} face seed crystal part 11 and a grown crystal part 12. In the upper portion of the grown crystal, a {10 $\bar{1}$0} facet appears. In FIG. 3, the arrow indicates the direction of crystal growing, and the dotted line indicates the crystal growing surface at the time when the {10 $\bar{1}$0}facet appeared first. Therefore, the crystal portion grown on the {10 $\bar{1}$0}facet corresponds to the hatched portion in this figure. The portion possesses the same polytype structure as the seed crystal, and avoid the occurrence of a screw dislocation corresponding to the empty tube defects or the center of spiral growth, when evaluated by above mentioned methods, and thus can be evaluated as fine quality. Further, it can be evaluated as particularly fine quality since it has substantially no appearance of pits and defects caused by the thermal etching.

Figure 4:
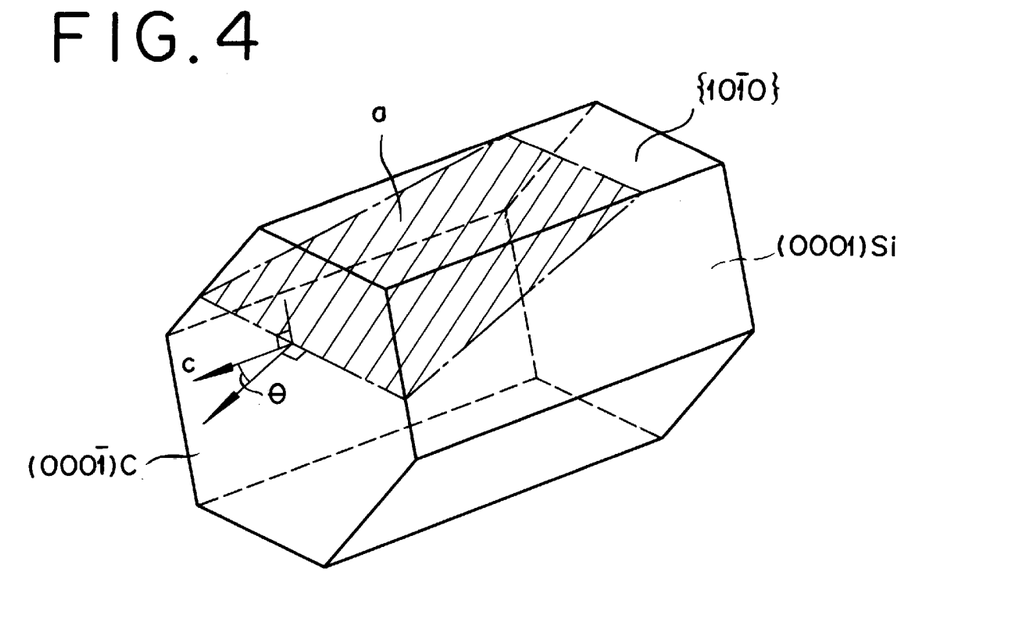
FIG. 4 is a diagram illustrating a crystal face which is able to be used as the seed crystal in an embodiment of this invention.

FIG. 4 illustrates a crystal face which is able to be used as the seed crystal in an embodiment of this invention. In this figure, the hatched portion indicates a crystal face which is inclined from the {10 $\bar{1}$0} plane by an off-angle θ in the direction of (000 $\bar{1}$)C plane (The off-angle θ is generically defined as the angle that is inclined from an optional plane vertical to the {0001} plane in the direction of (000 $\bar{1}$)C plane.). The SiC single crystal substrate having such crystal face may be obtained by inserting a cut to a SiC ingot grown on the {0001} face seed crystal according to the conventional sublimation method, the cut being along a plane inclined by the off-angle θ from the direction which is vertical to the {0001} plane.

The SiC single crystal of this invention can be obtained by using as the crystal seed a SiC single crystal substrate having an exposed face which is inclined from a plane vertical to the {0001} plane by an off-angle θ of 5° to 30°, more preferably 5° to 10° in the direction of (000 $\bar{1}$)C plane, and according to the above mentioned procedure. The SiC single crystal thus obtained has the same polytype structure as the seed crystals, and avoids the occurrence of a screw dislocation corresponding to the empty tube defects or the center of spiral growth, and has no or particularly little heterogeneous crystal grains, when evaluated by above mentioned methods. Thus, they can be determined as they have particularly fine qualities.

The SiC single crystal of this invention can be also obtained by using as the crystal seed a SiC single crystal substrate having an exposed face which is inclined from the {10 $\bar{1}$0} plane by an off-angle θ of 5° to 30°, more preferably 5° to 10° in the direction of (000 $\bar{1}$)C plane and according to the above mentioned procedure. Further, The SiC single crystal of this invention can be obtained by using as the crystal seed a SiC single crystal substrate having an exposed surface which forms the rotation angle ψ around the c-axis in the range of +5° to −5° with the plane which is inclined from the {10 $\bar{1}$0} plane by an off-angle θ of 5° to 30°, more preferably 5° to 10° in the direction of (000 $\bar{1}$)C plane, and according to the above mentioned procedure. The SiC single crystal thus obtained has the same polytype structure as the seed crystals, and avoids the occurrence of a screw dislocation corresponding to the empty tube defects or the center of spiral growth, and has no or particularly little heterogeneous crystal grains, when evaluated by above mentioned methods. Further, by observing surfaces of the crystals, they can be determined easily as they have facets, and as they have particularly fine qualities without suffering from the appearance of pits and defects caused by the thermal etching.

When the growth of a SiC single crystal is carried out by the sublimation method using the {0001} face of a seed crystal, spiral growth occurs without reference to the presence or absence of a screw dislocation on the surface of this seed crystal originally and, consequently, numerous screw dislocations corresponding to the centers of growth spiral are suffered to occur (which are observed as hexagonal etch pits resulting from the aforementioned etching with the fused KOH). When the growth is performed on a surface deviating from {0001} plane by angle $\alpha_1$ of about 60° to about 120°, the spiral growth does not occur and the screw dislocations corresponding thereto do not form.

Figure 5:
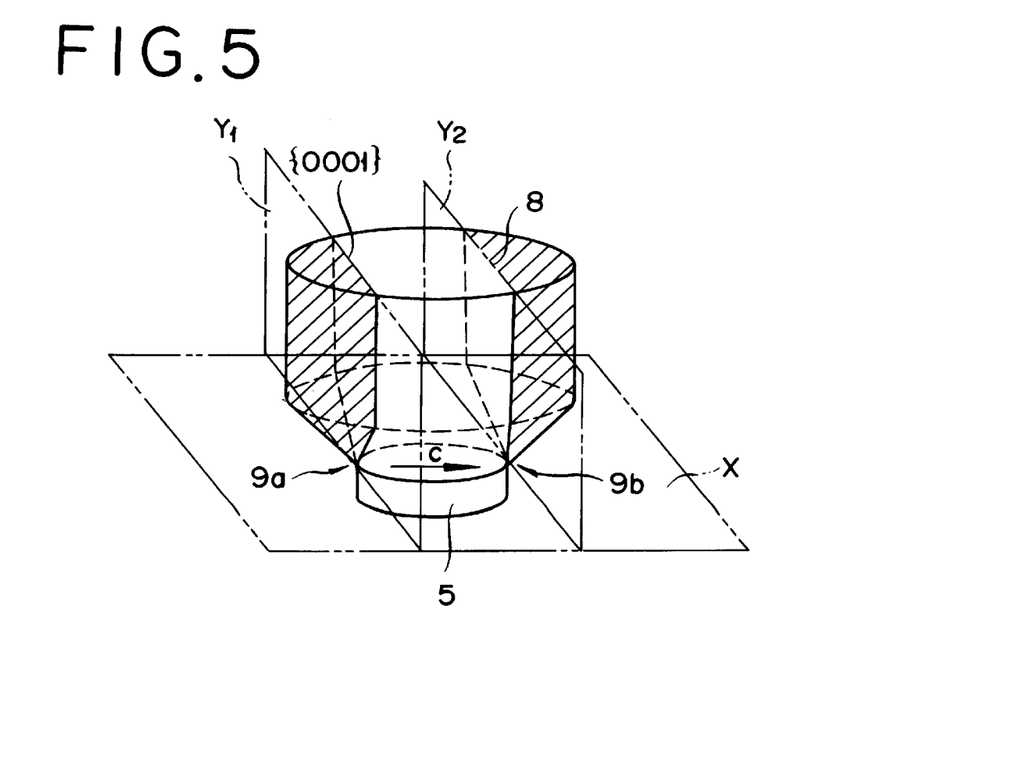
FIG. 5 is a perspective view illustrating in the form of a model a SiC single crystal ingot obtained by an embodiment of this invention using a {10 1̄0} face seed crystal. In this diagram, particular parts of the SiC single crystal ingot positioned outside two parallel virtual planes are depicted as hatched parts, wherein the planes are severally pass the opposite terminal parts of the seed crystal relative to the direction of the c-axis, wherein the planes are perpendicular to the c-axis, and wherein the planes perpendicularly intersect the exposed {10 1̄0}face of the seed crystal.

When a dislocation lying in the c-planes ({0001} planes or the basal planes), hereinafter referred to as "dislocation in the basal planes", of the crystal exists on the surface of the seed crystal substrate being used, this dislocation persists in the subsequent growth of crystal. Since the dislocation of this kind is suffered to persist exclusively in the c-planes, it is not suffered to persist in the parts of the grown SiC single crystal 8 which fall outside the width of the seed crystal 5 in the direction of the c-axis, namely the parts (hatched parts) positioned outside two parallel virtual planes $Y_1$ and $Y_2$ which intersect by the angle $\alpha_1$ a first virtual plane X including the exposed face of the seed crystal 5 as illustrated in FIG. 5. In the embodiment of FIG. 5, the second virtual planes $Y_1$ and $Y_2$ perpendicularly intersect the first virtual plane X, since the {10 $\bar{1}$0} face ($\alpha_1$=90°) substrate is used as the seed crystal 5. In FIG. 5, the lines of intersection of the first virtual plane X with the two second virtual planes $Y_1$ and $Y_2$ form the straight lines which run perpendicularly to the c-axis of the first seed crystal and pass the terminal parts 9a, 9b of the seed crystal relative to the direction of the c-axis. The second virtual planes $Y_1$ and $Y_2$ both correspond to the {0001} planes of the SiC single crystal 8.

In the SiC single crystal which is grown by the method of this invention described above, therefore, the parts (hatched parts shown in FIG. 5) falling outside the width of the seed crystal in the direction of the c-axis are particularly useful. These parts of the SiC single crystal contain neither the screw dislocation corresponding to the center of growth spiral nor the aforementioned dislocation in the basal planes and persisting from the seed crystal.

From the SiC single crystal grown by the method described above, the parts described above can be easily separated by inserting cuts one each along the aforementioned second virtual planes $Y_1$ and $Y_2$.

In a further preferred embodiment of this invention, a SiC single crystal is produced by the similar method as described above and using as the seed crystal a substrate cut out of either of the parts (hatched parts shown in FIG. 5) of the SiC single crystal and having an exposed face deviating from {0001} plane by angle $\alpha_2$ of about 60° to about 120°, preferably about 80° to 100°, more preferably about 90°. Since the SiC single crystal consequently obtained by this method has used the seed crystal which contains no dislocation in the basal planes, the whole ingot of the SiC single crystal has substantially the same quality as the hatched parts of the ingot illustrated in FIG. 5 obtained in the first embodiment described above and contains neither any screw dislocation corresponding to the center of growth spiral nor any dislocation in the basal planes and persisting from the seed crystal.

Figure 6:
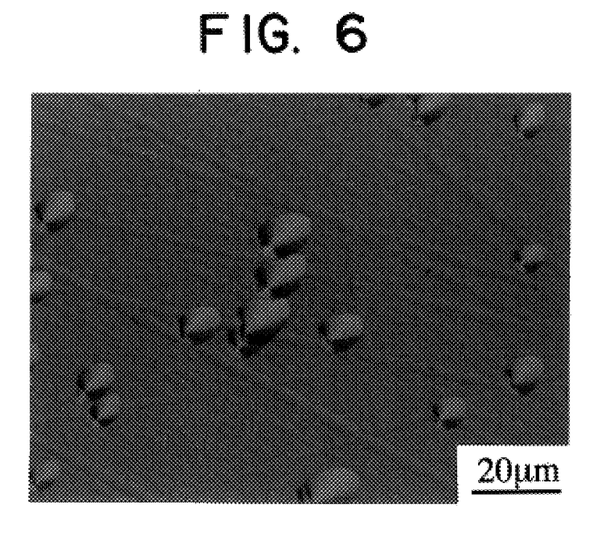
FIG. 6 is a photograph showing the shell-like form etch pits.

The hatched parts illustrated in FIG. 5 of the SiC single crystal obtained in the aforementioned embodiment and the SiC single crystal obtained in this embodiment are not only usable effectively as a seed crystal for the sublimation method but also usable particularly advantageously as a substrate for blue light-emitting diodes and electronic devices and are effective in notably enhancing the qualities and yields of such products because dislocations or defects of any sort occur very rarely or absolutely none of them occurs. The SiC single crystal of this invention which entails the occurrence of a dislocation only sparingly can be identified by the method of evaluation shown in a report, 11a-SY-18, inserted in the Autumn 1991 Glossary of Lectures, No. 1, page 30, for the 52nd meeting of the Applied Physical Society (Japan). The evaluation is started by cutting a slice out of a given single crystal ingot and polishing this slice so as to give rise to a wafer inclined by several degrees, typically by an angle $\phi$ in the range of from 2° to 10°, from the {0001} plane. The reason for the insertion of this slight inclination is to allow observation of dislocations in the basal planes, the dislocation which would not be observed if it occurred in the {0001} face. At this time, due attention should be given to the cutting and polishing work lest it should leave residual strain behind in the produced wafer. The wafer is etched with fused KOH at about 530° C. for about 10 minutes. The resultant etched wafer is observed under a Nomarski differential interference microscope to detect etch pits, if any. In this evaluation, the measured count of shell-like etch pits which represent dislocations in the basal planes is varied by the angle $\phi$. In theory when the angle $\phi$ is 90° the density of the appeared dislocations in the basal planes would be reached maximum, although the dislocations can not observed as the shell-like etch pits because of chemical characteristics of the face perpendicular to the {0001} plane. Thus, the count of the shell-like etch pit defined herein is not the measured one but an correction one. The correction value can be determined by dividing the measured value by $\sin \phi$ ($0° < \phi < 90°$). FIG. 6 is a photograph showing the shell-like form etch pits revealed on the Si-face side of a wafer inclined by 5° from the the {0001} plane.

The SiC single crystal of this invention which entails the occurrence of a dislocation only sparingly, when evaluated by the method described above, is found to contain absolutely no discernible hexagonal etch pit and to contain relatively small amount of the shell-like etch pits and more desirably no shell-like etch pit. The hexagonal etch pit represents a screw dislocation corresponding to the center of growth spiral or a empty tube defect as described above and the shell-like etch pit represents a dislocation in the basal planes. In the conventional SiC single crystal obtained by using as the seed crystal a substrate having an exposed {0001} face, such hexagonal etch pits and shell-like etch pits occur in a very large number (typically the hexagonal etch pits occur on the order of $10^4$–$10^5/cm^2$ and the shell-like etch pits on the order of $10^4$–$10^5/cm^2$). Thus, the conventional SiC single crystal can be easily discriminated from the SiC single crystal of this invention.

In another embodiment of this invention, the method of this invention can be modified without departure from the scope of this invention defined in the appended claims as easily conceived by persons of ordinary skill in the art on the basis of the foregoing disclosure of the invention.

EXAMPLE

Now, this invention will be described more specifically below with reference to working examples. The working examples cited herein below are introduced purely for the purpose of facilitating the understanding of this invention and are not meant to restrict this invention in any respect.

Examples 1 and 2

Figure 7:
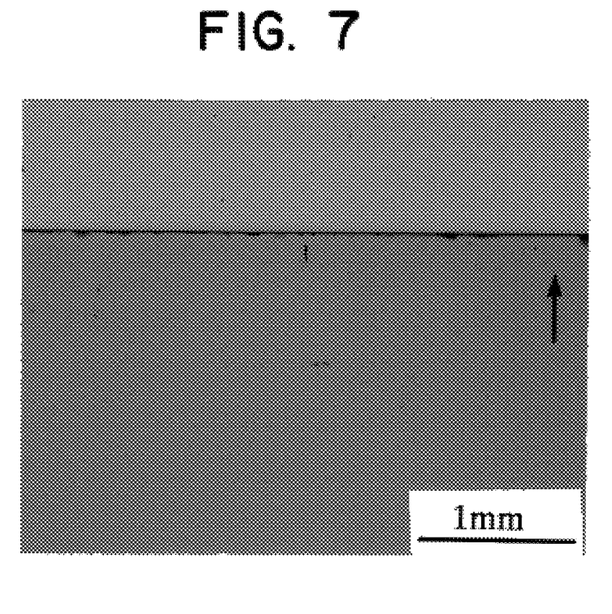
FIG. 7 is a photograph showing the upper part of grown single crystal in a {0001} wafer which was cut off from a SiC single crystal ingot obtained by an embodiment of this invention using a {10 1̄0} face seed crystal. In this Figure, the arrow shows the direction of crystal growing.

By using as seed crystal a 6H polytype {10 $\overline{1}$0} face substrate cut out of an ingot grown on a {0001} face, growth of crystal was carried out with the temperature of raw material set at 2,400° C., the temperature of the substrate at 2,340° C., the thermal gradient at 12° C./cm, and the pressure of the atmosphere at 20 Torr. By using as seed crystal a 4H polytype {10 $\overline{1}$0} face substrate cut out of another ingot grown on the {0001} face, growth of a crystal was carried out under the same conditions of temperature and pressure as described above. The speed of growth in each cases was invariably about 1 mm/hr in the direction perpendicular to the surface of the substrate. It was more or less larger in the growth on the {10 $\overline{1}$0} face than on the {0001} face. In these single crystal ingots, a large {10 $\overline{1}$0} facet parallel to the original substrate surface appeared at the upper part, several other facets appeared at the around side. At the upper parts of these ingots, no pits caused by the thermal etching was observed. FIG. 7 is a transmission photograph showing the upper part of grown single crystal in a {0001} wafer which was cut off from the SiC single crystal ingot thus obtained. In this Figure, the arrow shows the direction of crystal growing and the upper side of the photograph is the {10 $\overline{1}$0} facet. No defect caused by the thermal etching is observed in the wafer. Further, these crystals possessed very high transparency and exhibited ideal crystal quality.

The identification of polytype structure revealed that the crystal grown on the seed crystal substrate of the 6H polytype was wholly in the 6H polytype and the crystal on the seed crystal substrate of the 4H polytype was wholly in the 4H polytype. The {0001} wafers cut out of these crystals, when etched with a fused alkali and evaluated, showed absolutely no discernible sign of hexagonal etch pit, indicating that they possessed ideal quality.

Examples 3 and 4

Figure 8:
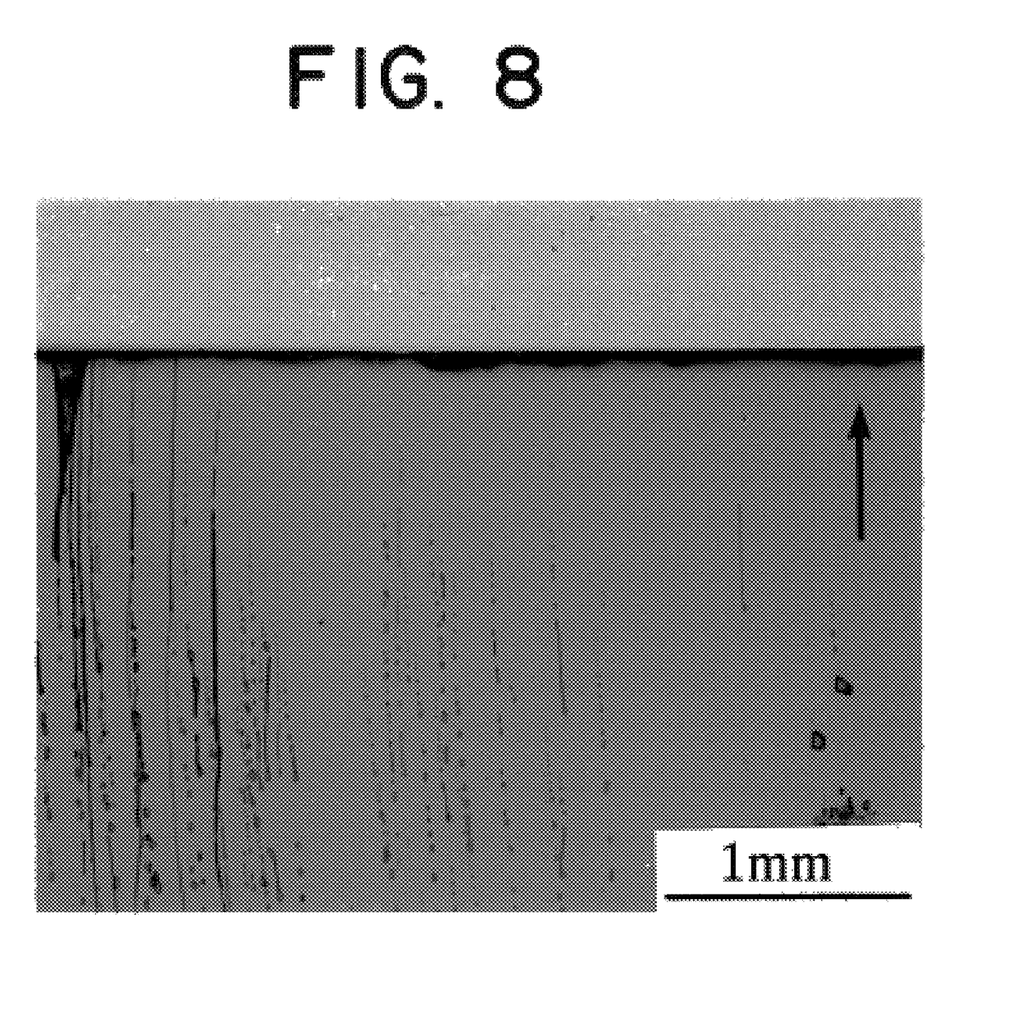
FIG. 8 is a photograph showing the upper part of grown single crystal in a {0001} wafer which was cut off from a SiC single crystal ingot obtained by an embodiment of this invention using a {11 2̄0} face seed crystal. In this Figure, the arrow shows the direction of crystal growing.

By using as seed crystal a 6H polytype {11 $\overline{2}$0} face substrate cut out of an ingot grown on the {0001} face, growth of crystal was carried out with the temperature of raw material set at 2,400° C., the temperature of the substrate at 2,340° C., the thermal gradient at 12° C./cm, and the pressure of the atmosphere at 20 Torr. Separately by using as seed crystal a 4H polytype {11 $\overline{2}$0} face cut out of another ingot grown on the {0001} face, growth of crystal was carried out under entirely the same conditions of temperature and pressure as described above. The speed of growth in each case was invariably about 1 mm/hr in the direction perpendicular to the substrate surface. It was more or less larger in the growth on the {11 $\overline{2}$0} face than on the {0001} face. In these single crystal ingots, {10 $\overline{1}$0} facets and several other facets appeared at the around side. These crystals possessed very high transparency and exhibited ideal quality. However, at the upper portion of the ingot, facets did not appear, and many pits (about $10^2/cm^2$) caused by the thermal etching appeared on the surface. FIG. 8 is a transmission photograph showing the upper part of grown single crystal in a {0001} wafer which was cut off from the SiC single crystal ingot thus obtained. In this Figure, the arrow shows the direction of crystal growing and the upper side of the photograph is the {11 $\bar{2}$0} face. The structures which appears as black parts in the photograph are the defects caused by the thermal etching (these corresponds to the above mentioned pits on the crystal surface.).

The identification of polytype structure revealed that the crystal grown on the seed crystal substrate of 6H polytype was wholly in the 6H polytype and the crystal on the seed crystal substrate of 4H polytype was wholly in the 4H polytype. The {0001} wafers cut out of these crystals, when etched with a fused alkali and evaluated, showed absolutely no sign of hexagonal etch pit, indicating that the crystals possessed ideal quality.

Examples 5 and 6

By using as seed crystal a 6H polytype substrate which was cut out of an ingot grown on the {0001} face and which has an exposed face which forms the rotation angle ψ around the c-axis of 3° with the plane deviating from {0001} plane by angle $\alpha_1$ of about 70° in the direction of {10 $\bar{1}$0} plane, growth of crystal was carried out with the temperature of raw material set at 2,400° C., the temperature of the substrate at 2,340° C., the thermal gradient at 12° C./cm, and the pressure of the atmosphere at 20 Torr. By using as seed crystal a 4H polytype substrate which was cut out of another ingot grown on the {0001} face and which has an exposed face which forms the rotation angle ψ around the c-axis of 3° with the plane deviating from {0001} plane by angle $\alpha_1$ of about 70° in the direction of {10 $\bar{1}$0} plane, growth of a crystal was carried out under the same conditions of temperature and pressure as described above. The speed of growth in each cases was invariably about 1 mm/hr in the direction perpendicular to the surface of the substrate. In these single crystal ingots thus obtained, facets parallel to the original substrate surface (the facet are different from the above mentioned {10 $\bar{1}$0} facet.) appeared in the upper parts of these ingots. In the upper parts of these ingots, few pits and defects caused by the thermal etching (about $10^1/cm^2$) was observed. Further, these crystals possessed very high transparency and exhibited ideal crystal quality.

The identification of polytype structure revealed that the crystal grown on the seed crystal substrate of the 6H polytype was wholly in the 6H polytype and the crystal on the seed crystal substrate of the 4H polytype was wholly in the 4H polytype. The {0001} wafers cut out of these crystals, when etched with a fused KOH and evaluated, showed absolutely no discernible sign of hexagonal etch pit, indicating that they possessed ideal quality.

Examples 7 and 8

By using as seed crystal a 6H polytype substrate which was cut out of an ingot grown on the {0001} face and which has an exposed face deviating from {0001} plane by angle $\alpha_1$ of about 70° in the direction of {11 $\bar{2}$0} plane, growth of crystal was carried out with the temperature of raw material set at 2,400° C., the temperature of the substrate at 2,340° C., the thermal gradient at 12° C./cm, and the pressure of the atmosphere at 20 Torr. By using as seed crystal a 4H polytype substrate which was cut out of another ingot grown on the {0001} face and which has an exposed face deviating from {0001} plane by angle $\alpha_1$ of about 70° in the direction of {11 $\bar{2}$0} plane, growth of a crystal was carried out under the same conditions of temperature and pressure as described above. The speed of growth in each cases was invariably about 1 mm/hr in the direction perpendicular to the surface of the substrate. At the upper portion of the single crystal ingots thus obtained, no facet appeared, and many pits and defects (about $10^2/cm^2$) caused by the thermal etching was observed.

The identification of polytype structure revealed that the crystal grown on the seed crystal substrate of the 6H polytype was wholly in the 6H polytype and the crystal on the seed crystal substrate of the 4H polytype was wholly in the 4H polytype. The {0001} wafers cut out of these crystals, when etched with a fused KOH and evaluated, showed absolutely no discernible sign of hexagonal etch pit, indicating that they possessed ideal quality.

Control 1

For comparison, by using a 6H {0001} face cut out of an ingot grown on the {0001} face as a seed crystal substrate, growth of crystal was carried out with the temperature of raw material set at 2,400° C., the temperature of the substrate at 2,340° C., the thermal gradient at 12° C./cm, and the pressure of the atmosphere at 20 Torr. The speed of growth was about 0.8 mm/hr. In the produced single crystal ingot, a large {0001} facet appeared.

The identification of polytype structure revealed that the crystal was wholly in the 6H polytype. When a {0001} wafer cut out of this crystal was etched with a fused alkali and evaluated, it showed nearly the same number of hexagonal etch pits of the same kind as indicated in the aforementioned Data EFM-88-24, p. 24, published by Electric Science Society (Japan), Electronic Material Study Group, on Sep. 5, 1988 (i. e. $10^2$ to $10^3$ of large size/$cm^2$, $10^4$ of medium size/$cm^2$, and $10^5$ of small size/$cm^2$).

Examples 9 to 11

By using as seed crystal a 6H polytype {10 $\bar{1}$0} face substrate cut out of an ingot grown on the {0001} face, growth of crystal was carried out with the temperature of raw material set at 2,340° C., the temperature of the substrate at 2,280° C., the thermal gradient at 12° C./cm, and the pressure of the atmosphere at 10 Torr. The speed of growth was about 1 mm/hr in the direction perpendicular to the surface of the substrate.

The identification of the polytype structure revealed the grown crystal was wholly in the 6H polytype. When a wafer inclined by 5° from the {0001} plane and cut out of the grown ingot was etched with a fused alkali and examined, absolutely no hexagonal etch pit was found and shell-like etch pits were found in the parts of the crystal falling inside the width of the seed crystal in the direction of the c-axis (outside the hatched parts of the SiC single crystal 8 in FIG. 5). In contrast, absolutely no etch pit of either hexagonal or shell-like form was observed in the parts of the crystal falling outside the width of the seed crystal in the direction of the c-axis (the hatched parts of the SiC single crystal 8 in FIG. 5).

When SiC single crystals were grown in the similar manner as described above by respectively using as seed crystal a 6H polytype {11 $\bar{2}$0} face substrate and a substrate having a exposed face perpendicular to {0001} plane and intervening between a {10 $\bar{1}$0} plane and a {11 $\bar{2}$0} plane and both of which are cut out of an ingot grown on a {0001} face, and they were similarly evaluated, they yielded the same results as described above.

Example 12

By using as seed crystal a 6H polytype substrate which has an exposed face deviating from the {0001} plane by about 80° toward a {10 $\bar{1}$0} plane direction and which was cut out of an ingot grown on the {0001} face, growth of crystal was carried out with the temperature of raw material set at 2,400° C., the temperature of the substrate at 2,340° C., the thermal gradient at 12° C./cm, and the pressure of the atmosphere at 10 Torr. The speed of growth was about 1 mm/hr in the direction perpendicular to the surface of the substrate.

The identification of the polytype structure revealed the grown crystal was wholly in the 6H polytype. When a wafer inclined by 5° from the {0001} plane and cut out of the grown ingot was etched with a fused KOH and examined, absolutely no hexagonal etch pit was found and shell-like etch pits were found in the parts of the crystal falling inside the width of the seed crystal in the direction of the c-axis (the inner part rested between two parallel second virtual planes $Y_1$, $Y_2$, each passing one of terminal parts of the width relative to the direction of the c-axis of the seed crystal used, intersecting by about 80° the exposed face of the seed crystal and also intersecting perpendicularly the c-axis of the seed crystal). In contrast, absolutely no etch pit of either hexagonal or shell-like form was observed in the parts of the crystal falling outside the width of the seed crystal in the direction of the c-axis (the outer parts from the parallel second virtual planes $Y_1$, $Y_2$).

Examples 13 to 15

By using as a seed crystal substrate a 6H polytype {10 $\bar{1}$0} face cut out of one of the parts of the grown ingot obtained in Examples 9 to 11 falling outside the width in the c-axis of the seed crystal, growth of crystal was carried out with the temperature of raw material set at 2,340° C., the temperature of the substrate at 2,280° C., the thermal gradient at 12° C./cm, and the pressure of the atmosphere at 10 Torr. The speed of growth was about 1 mm/hr in the direction perpendicular to the surface of the substrate.

The identification of polytype structure revealed that the grown crystal was wholly in the 6H polytype. When a wafer inclined by 5° from the {0001} plane and cut out of the grown ingot was etched with a fused KOH and evaluated as to crystallinity, absolutely no etch pit was observed in the parts of the grown crystal falling within the width in the direction of the c-axis of the seed crystal. Absolutely no etch pit was detected in the parts of the grown crystal falling outside the width in the direction of the c-axis of the seed crystal.

When SiC single crystals were grown in the similar manner as described above by using respectively as seed crystal a 6H polytype {11 $\bar{2}$0} face substrate and a substrate having a exposed face perpendicular to the {0001} plane and intervening between a {10 $\bar{1}$0} plane and a {11 $\bar{2}$0} plane both of which are cut out of one of the parts of the ingot grown in Examples 9 to 11 falling outside the width in the direction of the c-axis of the seed crystal and they were evaluated in the same manner as described above, there were obtained the same results as mentioned above.

Example 16

By using as seed crystal a 6H polytype substrate which was cut out of an ingot grown on the {0001} face and which has an exposed face which is inclined from the {10 $\bar{1}$0} plane by an off-angle θ of 15° in the direction of (000 $\bar{1}$)C face, growth of crystal was carried out with the temperature of raw material set at 2,340° C., the temperature of the substrate at 2,280° C., and the pressure of the atmosphere at 10 Torr. By using as seed crystal a 4H polytype substrate which was cut out of another ingot grown on the {0001} face and which has an exposed face which is inclined from the {10 $\bar{1}$0} plane by an off-angle θ of 15° in the direction of (000 $\bar{1}$)C plane, growth of a crystal was carried out under the same conditions of temperature and pressure as described above. The speed of growth in each cases was invariably about 1 mm/hr in the direction perpendicular to the surface of the substrate. In these single crystal ingots thus obtained, the upper parts of these ingots were covered with some facets approximately parallel to the original substrate surface. On the surface of the ingots, no crystal grain having a different crystal direction from that of the seed was observed. Further, on the observation using the polarizing microscope of a {0001} wafer which was cut off from the obtained SiC single crystal ingot and polished, the crystal grain was not observed. The growth of a crystal ingot above mentioned was repeated several times, but the crystal grain was not observed in each cases.

The identification of polytype structure revealed that the crystal grown on the seed crystal substrate of the 6H polytype was wholly in the 6H polytype and the crystal on the seed crystal substrate of the 4H polytype was wholly in the 4H polytype. The {0001} wafers cut out of these crystals, when etched with a fused KOH and evaluated, showed absolutely no discernible sign of hexagonal etch pit, indicating that they possessed ideal quality.

Examples 18 to 19

By using as seed crystal a 6H polytype substrate which was cut out of an ingot grown on the {0001} face and which has an exposed face which is inclined from the {10 $\bar{1}$0} plane by an off-angle θ of 15° in the direction of (0001)Si plane, growth of crystal was carried out with the temperature of raw material set at 2,340° C., the temperature of the substrate at 2,280° C., and the pressure of the atmosphere at 10 Torr. By using as seed crystal a 4H polytype substrate which was cut out of another ingot grown on the {0001} face and which has an exposed face which is inclined from the {10 $\bar{1}$0} plane by an off-angle θ of 15° in the direction of (0001)Si plane, growth of a crystal was carried out under the same conditions of temperature and pressure as described above. The speed of growth in each cases was invariably about 1 mm/hr in the direction perpendicular to the surface of the substrate. In these single crystal ingots thus obtained, the upper parts of these ingots were covered with some facets approximately parallel to the original substrate surface. On the surface of the ingots, some crystal grains each having a different crystal direction from that of the seed were observed. Further, on the observation using the polarizing microscope of a {0001} wafer which was cut off from the obtained SiC single crystal ingot and polished, the portions where such crystal grain was escalated along the crystal growing direction were observed.

The identification of polytype structure revealed that the crystal grown on the seed crystal substrate of the 6H polytype was wholly in the 6H polytype and the crystal on the seed crystal substrate of the 4H polytype was wholly in the 4H polytype. The {0001} wafers cut out of these crystals, when etched with a fused KOH and evaluated, showed absolutely no discernible sign of hexagonal etch pit, indicating that they possessed ideal quality.

We claim:

1. A method for the growth of an SiC single crystal which is substantially free from defects corresponding to hexagonal etch pits, and which has a retarded density of pit and void defects caused by thermal etching, which method comprises:

a. introducing a seed crystal of SiC single crystal having an exposed face which forms a rotation angle ψ around the c-axis of +5° to −5° with a plane deviating from {0001} plane by an angle $\alpha_1$ of about 60° to about 120° in the direction of {10$\bar{1}$0} plane, and SiC powder as a raw material into a graphite crucible, b. elevating the temperature of said SiC powder in an atmosphere of inert gas to a level sufficient for sublimation, while c. elevating the temperature of the exposed face of said seed crystal to a level slightly lower than the temperature of said SiC powder, and d. keeping said SiC powder and said seed crystal at the above temperatures for a period sufficient for an SiC single crystal of the same polytype as said seed crystal to grow to a desired height on said exposed face of said seed crystal.

2. The method according to claim 1, wherein said angle $\alpha_1$ is in the range of about 80° to about 100°.

3. The method according to claim 1, wherein said rotation angle ψ is zero.

4. The method according to claim 2, wherein said rotation angle ψ is zero.

5. The method according to claim 1, wherein said seed crystal has an exposed face of {10$\bar{1}$0} plane.

6. An SiC single crystal produced by the method set forth in claim 1, said crystal being substantially free from defects corresponding to hexagonal etch pits, and having a retarded density of pits and void defects caused by thermal etching.

7. An SiC single crystal produced by the method set forth in claim 5, said crystal being substantially free from defects corresponding to hexagonal etch pits, and having a retarded density of pits and void defects caused by thermal etching.

8. A method for the production of an SiC single crystal which is substantially free from defects corresponding to hexagonal etch pits and dislocations corresponding to shell-like etch pits, and which has a retarded density of pits and void defects caused by thermal etching, and which is substantially free from heterogeneous crystal grains,-which method comprises:

a. introducing a seed crystal of SiC single crystal having an exposed face which forms a rotation angle ψ around the c-axis of +5° to −5° with a plane deviating from {0001} plane by an angle $\alpha_1$ of about 60° to about 120° in the direction of {10$\bar{1}$0} plane, and SiC powder as a raw material into a graphite crucible, b. elevating the temperature of said SiC powder in an atmosphere of inert gas to a level sufficient for sublimation, while c. elevating the temperature of the exposed face of said seed crystal to a level slightly lower than the temperature of said SiC powder, and d. keeping said SiC powder and said seed crystal at the above temperatures for a period sufficient for an SiC single crystal of the same polytype as said seed crystal to grow to a desired height on said exposed face of said seed crystal, e. removing the resultant grown SiC single crystal from said crucible, and f. inserting a cut along a plane into the removed SiC single crystal, said plane passing a terminal part of the width relative to the direction of the c-axis of said seed crystal, intersecting by said angle $\alpha_1$ said exposed face of said seed crystal and also intersecting perpendicularly the c-axis of said seed crystal, thereby obtaining a part of said grown SiC single crystal falling outside the width in the direction of the c-axis of said seed crystal.

9. The method according to claim 8, wherein said exposed face of said seed crystal is the {10$\bar{1}$0} plane.

10. An SiC single crystal produced by the method set forth in claim 8, said crystal being substantially free from defects corresponding to hexagonal etch pits and dislocations corresponding to shell-like etch pits, having a retarded density of pits and void defects caused by thermal etching, and being substantially free from heterogeneous crystal grains.

11. An SiC single crystal produced by the method set forth in claim 9, said crystal being substantially free from defects corresponding to hexagonal etch pits and dislocations corresponding to shell-like etch pits, having a retarded density of pits and void defects caused by thermal etching, and being substantially free from heterogeneous crystal grains.

12. A method for the growth of an SiC single crystal which is substantially free from defects corresponding to hexagonal etch pits and dislocations corresponding to shell-like etch pits, and which has a retarded density of pits and void defects caused by thermal etching, and which is substantially free from heterogeneous crystal grains, which method comprises:

a. introducing a seed crystal cut out of the SiC single crystal set forth in claim 8 in such a manner as to have an exposed face which forms a rotation angle ψ around the c-axis of +5° to −5° with a plane deviating from {0001} plane by an angle $\alpha_2$ of about 60° to about 120° in the direction of {10$\bar{1}$0} plane, and SiC powder as a raw material into a graphite crucible, b. elevating the temperature of said SiC powder in an atmosphere of inert gas to a level sufficient for sublimation, while c. elevating the temperature of the exposed face of said seed crystal to a level slightly lower than the temperature of said SiC powder, and d. keeping said SiC powder and said seed crystal at said specific temperatures for a period sufficient for an SiC single crystal of the same polytype as said seed crystal to grow to a desired height on said exposed face of said seed crystal.

13. The method according to claim 12, wherein said exposed face of said seed crystal is the {10$\bar{1}$0} plane.

14. An SiC single crystal produced by the method set forth in claim 12, said crystal being substantially free from defects corresponding to hexagonal etch pits and dislocations corresponding to shell-like etch pits, having a retarded density of pits and void defects caused by thermal etching, and being substantially free from heterogeneous crystal grains.

15. An SiC single crystal produced by the method set forth in claim 13, said crystal being substantially free from defects corresponding to hexagonal etch pits and dislocations corresponding to shell-like etch pits, having a retarded density of pit and void defects caused by thermal etching, and being substantially free from heterogeneous crystal grains.

* * * * *